(12) United States Patent
Wang et al.

(10) Patent No.: US 11,345,824 B2
(45) Date of Patent: May 31, 2022

(54) POLYMER-POLYMETALATE COMPOSITE INK, AND PREPARATION METHOD AND APPLICATION THEREOF

(71) Applicant: Suzhou Institute of Nano-Tech and Nano-Bionics, Chinese Academy of Sciences, Suzhou (CN)

(72) Inventors: Yiling Wang, Suzhou (CN); Qun Luo, Suzhou (CN); Na Wu, Suzhou (CN); Changqi Ma, Suzhou (CN)

(73) Assignee: SUZHOU INSTITUTE OF NANO-TECH AND NANO-BIONICS, Suzhou (CN)

( * ) Notice: Subject to any disclaimer, the term of this patent is extended or adjusted under 35 U.S.C. 154(b) by 72 days.

(21) Appl. No.: 15/535,617

(22) PCT Filed: Dec. 17, 2015

(86) PCT No.: PCT/CN2015/097676
§ 371 (c)(1),
(2) Date: Jun. 13, 2017

(87) PCT Pub. No.: WO2016/095828
PCT Pub. Date: Jun. 23, 2016

(65) Prior Publication Data
US 2018/0016456 A1 Jan. 18, 2018

(30) Foreign Application Priority Data

Dec. 17, 2014 (CN) .......................... 201410787773.9
Oct. 27, 2015 (CN) .......................... 201510706292.5

(51) Int. Cl.
*C09D 11/037* (2014.01)
*C09D 11/102* (2014.01)
(Continued)

(52) U.S. Cl.
CPC ............ *C09D 11/106* (2013.01); *C08L 65/00* (2013.01); *C09D 11/037* (2013.01);
(Continued)

(58) Field of Classification Search
CPC ... C09D 11/037; C09D 11/102; C09D 11/106; C08F 12/26; C08F 226/06; B82Y 40/00;
(Continued)

(56) References Cited

U.S. PATENT DOCUMENTS

2010/0247923 A1* 9/2010 Hsu .................. C08L 65/00
428/419

FOREIGN PATENT DOCUMENTS

CN 101977985 A 2/2011
CN 102008901 A * 4/2011 ............. B01D 67/00
(Continued)

OTHER PUBLICATIONS

Seung Joo Lee, Byung Soon Kim, Jae-Yeon Kim, Abd. Rashid bin Mohd Yusoff 1 Jin Jang, Stable organic photovoltaic with PEDOT:PSS and MoOX mixture anode interfacial layer without encapsulation, Organic Electronics 19 (2015) 140-146 (Year: 2015).*
(Continued)

*Primary Examiner* — Bijan Ahvazi
(74) *Attorney, Agent, or Firm* — PROI Intellectual Property US

(57) ABSTRACT

The present invention discloses a polymer-metal compound composite ink, a preparation method and application thereof. The composite ink comprises: at least one polymer; at least one metal compound material, the metal compound material being selected from polyoxometalate compounds and nanocrystalline metal oxides; at least one solvent which is used for forming a disperse system in the form of a uniform fluid together with the remaining components in the composite ink. The present invention also discloses a method for
(Continued)

preparing the composite ink. The composite ink of the present invention is easily available in raw material, easy to prepare and low in cost, and can be manufactured into a composite thin film by spin-coating, printing or in other ways. The composite thin film, as an electrode modification layer, can be applied to photoelectric devices such as solar cells or light-emitting diodes, so as to improve the contact performance between an electrode and an organic active layer and thus enhance the performance and yield of photoelectric devices.

13 Claims, 8 Drawing Sheets

(51) Int. Cl.
| | | |
|---|---|---|
| *C09D 11/106* | (2014.01) | |
| *C08L 65/00* | (2006.01) | |
| *B82Y 40/00* | (2011.01) | |
| *C01G 17/00* | (2006.01) | |
| *C01G 28/00* | (2006.01) | |
| *C01G 31/02* | (2006.01) | |
| *C01G 39/02* | (2006.01) | |
| *C01G 41/02* | (2006.01) | |
| *C08F 12/26* | (2006.01) | |
| *C08F 226/06* | (2006.01) | |
| *H05B 33/00* | (2006.01) | |

(52) U.S. Cl.
CPC ............ *C09D 11/102* (2013.01); *B82Y 40/00* (2013.01); *C01G 17/00* (2013.01); *C01G 28/005* (2013.01); *C01G 31/02* (2013.01); *C01G 39/02* (2013.01); *C01G 41/02* (2013.01); *C08F 12/26* (2013.01); *C08F 226/06* (2013.01); *H05B 33/00* (2013.01)

(58) Field of Classification Search
CPC ...... C01G 17/00; C01G 28/005; C01G 31/02; C01G 39/02; C01G 41/02; H05B 33/00
See application file for complete search history.

(56) References Cited

FOREIGN PATENT DOCUMENTS

| CN | 102008901 A | | 4/2011 | |
|---|---|---|---|---|
| CN | 102505185 A | * | 6/2012 | ............... D01D 1/02 |
| CN | 102769102 A | * | 11/2012 | ............. H01L 51/44 |
| CN | 103228279 A | | 7/2013 | |
| CN | 103913492 A | * | 7/2014 | ............. G01N 27/30 |
| CN | 103913492 A | | 7/2014 | |

OTHER PUBLICATIONS

Leonidas C.Palilis, Maria Vasilopoulou,, Vassilios Constantoudis, Panagiotis Argitis , Solution processable tungsten polyoxometalate as highly effective cathode interlayer forimprovedefficiencyandstabilitypolymersolarcells, Solar Energy Materials& SolarCells 114 (2013) 205-213 (Year: 2013).*

Maria Vasilopoulou, Antonios M. Douvas, Leonidas C., and Panagiotis Argitis, Old Metal Oxide Clusters in New Applications: Spontaneous Reduction of Keggin and Dawson Polyoxometalate Layers by a Metallic Electrode for Improving Efficiency in Organic, J. Am. Chem. Soc. 2015, 137, 6844-6856 (Year: 2015).*

Chunchen Yuan, Shuangshuang Guo, Shiming Wang, Lin Liu, Weilin Chen, and Enbo Wang, Electropolymerization Polyoxometalate (POM)-Doped PEDOT Film Electrodes with Mastoid Microstructure and Its Application in Dye-Sensitized Solar Cells (DSSCs), Ind. Eng. Chem. Res. 2013, 52, 6694-6703 (Year: 2013).*

International Search Report of international application PCT/CN2015/097676.

* cited by examiner

POLYMER-POLYMETALATE COMPOSITE INK, AND PREPARATION METHOD AND APPLICATION THEREOF

TECHNICAL FIELD OF THE INVENTION

The present invention particularly relates to a polymer-metal compound composite ink and a preparation method and application thereof, for example, an application in photoelectric devices, belonging to the field of photoelectric semiconductor material and devices.

BACKGROUND OF THE INVENTION

Compared with conventional inorganic photoelectric devices, novel solution-processed photoelectric devices based on organic semiconductor material, for example, organic solar cells, perovskite solar cells and Organic Light-Emitting Diodes (OLEDs), have a very broad application prospect due to their advantages of low cost, light and soft properties, convenience for large-scale roll-to-roll production and the like. Such novel photoelectric conversion devices are generally of a sandwich multilayer structure including an active layer and electrodes. The electrodes include a cathode and an anode. Wherein, the electrodes mainly function to complete injection (e.g., electroluminescent devices) or collection (solar cell devices) of electrons or holes. In many cases, since the work functions between the electrodes and the photoelectric active layer are not matched and there is an interface barrier, the injection or collection efficiency of electrons or holes is influenced and the device performance is thus influenced. By introducing an interface modification layer between the electrodes and the active layer, the surface work function of the electrodes can be adjusted so that Ohmic contact is formed between the electrodes and the photoelectric active layer. As a result, the injection or collection efficiency of electrons is decreased, and the purpose of improving the device performance is achieved.

At present, common electrode modification material includes two categories, i.e., metal oxides and polymers. The metal oxides, for example, zinc oxide, titanium oxide, tin oxide and the like (particularly suitable for cathode modification), as well as molybdenum oxide, vanadium oxide, nickel oxide and the like (particularly suitable for anode modification) become excellent electrode interface modification material due to their advantages of good electricity conductivity, high material stability and the like. However, conventional metal oxide thin films are mostly deposited by vacuum sputtering which is not compatible with ink-based printing. By preparing various nanoparticles into a solution, the requirements for solution-processing organic photoelectric devices may be fulfilled. When the particle size of the metal oxides is decreased to the nanometer scale, for example, 3 nm to 50 nm, particularly about 5 nm to 15 nm, the metal nanoparticles may be dispersed in a solvent. In this way, the requirements for solution-processing and solution-preparation are fulfilled. For example, it is reported that, by solution-preparing zinc oxide nanoparticles (ZnO), titanium oxide nanoparticles ($TiO_2$), cesium-doped titanium oxide nanoparticles ($TiO_2$:Cs), molybdenum oxide nanoparticles ($MoO_3$), vanadium oxide ($V_2O_5$) nanoparticles or nickel oxide (NiO) nanoparticles as the electrode modification layer, the efficiency and stability of devices such as organic solar cells are effectively improved [for example, referring to Adv. Mater. 2012, 24 (38), 5267-5272]. However, since the nanoparticle disperse liquid is likely to result in aggregation of nanoparticles when printing and preparing a thin film, there are many defects on the surface of the thin film and the thin film is rigid and easy to fracture. As a result, the device performance is decreased or even the device is short-circuited (referring to ACS Appl. Mater. Interfaces 2014, 6 (20), 18172-18179). In addition, since the energy band structure of pure metal oxides is determined by a material preparation process and is difficult to adjust in the later stage, the metal oxides are somewhat limited in practical applications.

For polymers, the poly(3,4-ethylenedioxythiophene)-polystyrene sulfonate (PEDOT:PSS) conductive polymer mainly used as an anode modification layer has the advantages of high electricity conductivity, high film quality and the like. Nonetheless, in order to deposit the PEDOT:PSS on an organic thin film layer, generally, a surfactant needs to be added into the PEDOT:PSS for modification, or surface treatment needs to be performed on an organic active layer to reduce its surface energy. However, it is difficult to remove the surfactant in the later stage. If the surface of the organic active layer is treated by plasma or ultraviolet ozone, the equipment is highly required, and it is likely to damage the organic thin film to a certain extent so that the service life of the device is shortened. Polymer materials used for cathode modification generally are ionic conjugated polymers, for example, polyfluorene, polythiophene, polycarbazole and derivatives thereof; or non-conjugated polymers, for example, polyacetylamine or other derivatives. However, the methods for synthesizing and preparing such ionic polymer electrolytes based on the conjugated polymer material are complicated and high in material cost. Another kind of polymers used for cathode interface modification are non-conjugated polymers (for example, referring to Science 2012, 336 (6079), 327-332). Compared with the conjugated polymer electrolytes, such non-conjugated polymers as commercially mature polymers may be prepared on a large scale and have the advantages of low cost, mature technology and the like. However, due to the poor electricity conductivity of the polymers, when the polymers are used as an electrode interface modification layer, the device performance is highly dependent upon the thickness of the thin film. In other words, the device performance is very sensitive to the thickness of the electrode interface modification layer. The optimal thickness is generally between 10 nm and 15 nm. Thus, the preparation process of the device is very difficult.

By a method of using a metal oxide nanoparticle/conductive polymer double-layer structure as an electrode modification layer, i.e., first depositing a layer of metal oxide nanoparticle thin film on an electrode surface and then depositing a layer of conjugated polymer polyelectrolyte thin film on this metal oxide nanoparticle thin film, the problem of non-uniformity of the metal nanoparticle coating can be overcame to a certain extent. However, in this method, the aggregation of metal oxide nanoparticles still occurs during the deposition of the first metal oxide thin film. In addition, the number of electrode modification interfaces is increased, the factors which influence the device performance are also increased, and the preparation process of the device becomes more complicated.

Furthermore, it was reported recently that nanoclusters also play a role of modifying a work function. Compared with the metal oxide nanoparticles, such nanocluster material has the advantages of inexpensive material, simple ink configuration, good solubility, and solution-processed capability. Polyoxometalates may be used as an anode interface modification layer. For example, phosphomolybdic acid (PMA) reported in some literatures may be used as an anode buffer layer for an organic solar cell with an inverted structure. As an anode buffer layer of a PTB7:$PC_{71}BM$ device, the device performance at a high efficiency of 8.3% may be realized. In addition, polyoxometalates may also be used as a cathode interface modification layer. For example, $H_3PW_{12}O_{40}$ reported in literatures may be used as a cathode buffer layer for a light-emitting diode and an organic solar cell. However, such material also has the problems of serious aggregation and high film roughness.

SUMMARY OF THE INVENTION

A main objective of the present invention is to provide a polymer-metal compound composite ink and a preparation method thereof. The polymer-metal compound composite ink may be used for electrode interface modification, and may realize the adjustment of a surface work function of electrodes so as to overcome the deficiencies in the prior art.

To achieve the inventive objective, the present invention employs the following technical solutions.

An embodiment of the present invention provides a polymer-metal compound composite ink, containing:

at least one polymer;

at least one metal compound material, the metal compound material being selected from polyoxometalate compounds and nanocrystalline metal oxides; and at least one solvent which is used for forming a disperse system in the form of a uniform fluid together with the remaining components in the composite ink.

In some implementations, the metal compound material is selected from polyoxometalate compounds.

Further, the polymer includes a conjugated polymer and/or a non-conjugated polymer.

In some implementations, the polymer-metal compound composite ink contains:

at least one polymer with a fatty amine unit;

at least one nanocrystalline metal oxide, and at least one organic alcohol as the solvent.

Further, the nanocrystalline metal oxide contains a metal element selected from the following element group: molybdenum, vanadium, tungsten, nickel, titanium, tin and zinc.

Further, the nanocrystalline metal oxide may further contain a metal and/or non-metal element, different from any metal element in the element group and an oxygen element.

An embodiment of the present invention further provides a method for preparing the polymer-metal compound composite ink, including the step of: uniformly mixing the polymer and the metal compound material in a solvent to form the composite material.

An embodiment of the present invention further provides a thin film which is mainly formed from the polymer-metal compound composite ink.

An embodiment of the present invention further provides a method for preparing a thin film, including the step of: applying the polymer-metal compound composite ink onto a substrate by coating or printing to form the thin film.

An embodiment of the present invention further provides a device, including the thin film.

Compared with the prior art, the present invention has the following advantages:

1) the polymer-metal compound composite ink and the thin film of the present invention are easily available in raw material, easy to prepare and low in cost;

2) the use of the thin form formed from the polymer-metal compound composite ink of the present invention as interface modification material may improve the film compactness of the interface modification layer, reduce the surface roughness of the interface modification layer and thus improve the performance of the device; for example, when used for electrode interface modification, the thin film may realize the adjustment of a surface work function of electrodes;

3) the polymer-metal compound composite ink of the present invention may be deposited by spin-coating, blade-coating, ink-jet printing or in other common ways to form a thin film, and thus has the advantages of simple processing process and the like; and 4) when the polymer-metal compound composite ink of the present invention is used as interface modification material, the performance of the formed device is lowly dependent upon the thickness of the thin film, the process requirements for the preparation of the device can be reduced, and it is advantageous to increase the yield of the device.

DETAILED DESCRIPTION OF THE INVENTION

Figure 1:
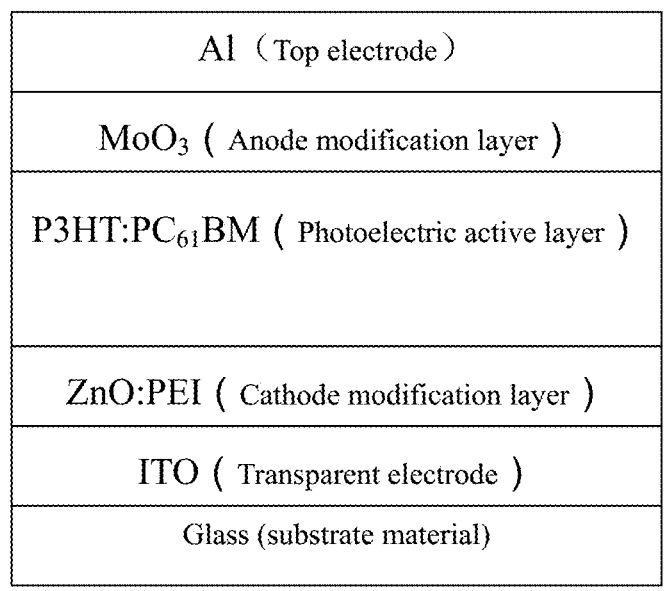
FIG. 1 is a schematic structure diagram of a solar cell device according to Embodiment 1.
Figure 2:
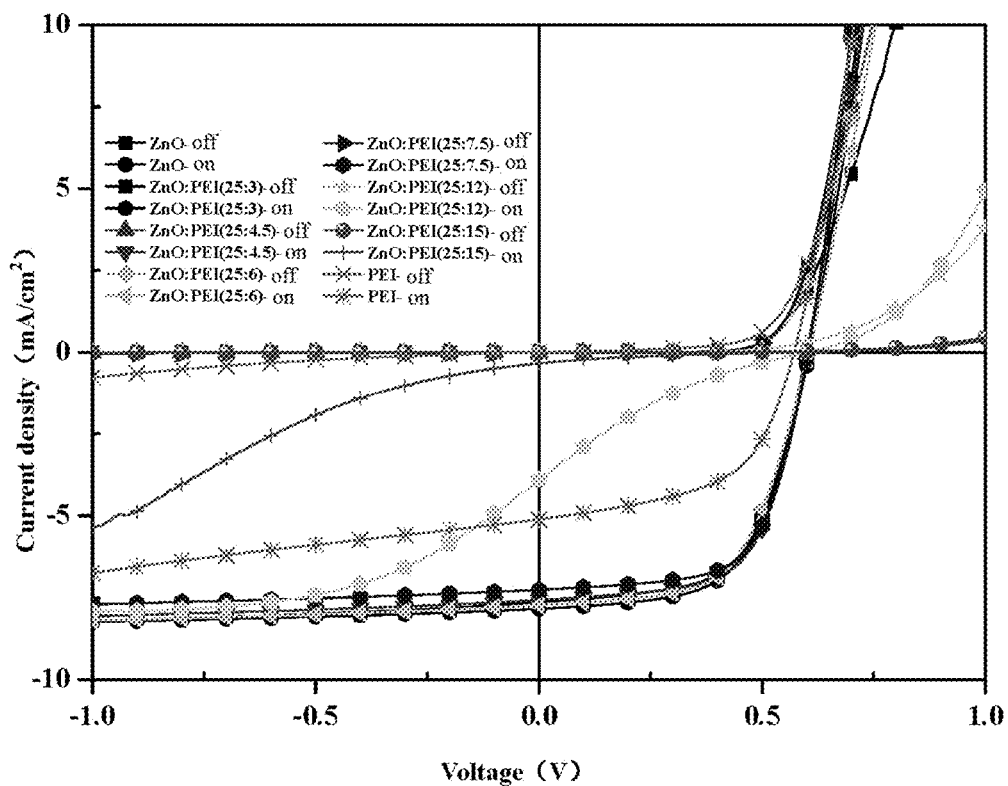
FIG. 2 is a J-V graph of a P3HT:$PC_{61}BM$ system solar cell using ZnO, ZnO:PEI and PEI as a cathode modification layer according to Embodiment 1.

In view of the various defects in the prior art, the inventor(s) has (have) proposed the technical solutions of the present invention by long-term study and lots of practice. The technical solutions of the present invention will be described below in more details. However, it should be understood that, within the scope of the present invention, the technical features described above and the technical features to be specifically described hereinafter (e.g., in embodiments) of the present invention may be combined with each other to form new or preferred technical solutions. For the purpose of simplicity, these new or preferred technical solutions will not be described one by one.

In some embodiments, one aspect of the present invention provides a polymer-metal compound composite ink, containing:

at least one polymer;

at least one metal compound material, the metal compound material being selected from polyoxometalate compounds and nanocrystalline metal oxides; and at least one solvent which is used for forming a disperse system in the form of a uniform fluid together with the remaining components in the composite ink.

In a first implementation, the polymer-metal compound composite ink is a polymer-nanocrystalline metal oxide composite ink, containing:

at least one polymer with a fatty amine unit, at least one nanocrystalline metal oxide, and at least one organic alcohol as the solvent.

In the ink provided in the first implementation of the present invention, the polymer can effectively fill gaps between metal oxide nanoparticles, so that the compactness and uniformity of a compound thin film are improved and the roughness of the surface of an electrode interface modification layer is reduced. Moreover, the fatty amine unit contained in the polymer in the ink formulation can adjust the work function of the metal oxide, reduce the surface defect density of the metal oxide in the thin film, and increase the carrier concentration and carrier mobility, so that the performance of the polymer-nanocrystalline metal oxide thin film in modifying an electrode interface is adjusted, and the application performance of the photoelectric device is changed.

The fatty amine unit includes primary fatty amine, secondary fatty amine or tertiary fatty amine. That is, the molecule contains one of the following molecular structure units:

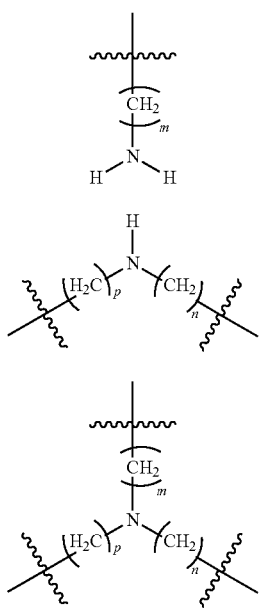

where, m, n and p in the formulae are independently selected from integers from 1 to 12.

The term "containing" means that the molecule contains at least one of the structure units. The structure units may contain the fatty amine structure unit on a main chain of the polymer molecule or on a side chain of the polymer molecule, or on both the main chain and side chain of the molecule.

Preferably, the polymer containing a fatty amine unit in the present invention is selected from straight-chain or branched polyethyleneimine, end-ethoxylated or ethylaminatedpolyethyleneimine, copolymer containing a polyethyleneimine fragment, or a mixture thereof. All the straight-chain or branched polyethyleneimine, the end-ethoxylated or ethylaminatedpolyethyleneimine, and the copolymer containing a polyethyleneimine fragment constructed on this basis are industrially mature chemical products and have the advantages of mature material preparation process, stable product performance and the like. Thus, this is a preferred way of implementing the solutions of the present invention. In addition, the mixture of the polymers at any ratio may also be applied to the solutions of the present invention.

Wherein, the nanocrystalline metal oxide may be selected from, but not limited to, oxides of elements such as zinc, titanium, molybdenum, vanadium, tungsten and nickel, and oxides doped with other elements. For example, ZnO, Al:ZnO, Mg:ZnO, Ca:ZnO, Ga:ZnO, In:ZnO, Ga, In:ZnO, F:ZnO, N:ZnO, $TiO_2$, $Y:TiO_2$, $Yb:TiO_2$, $Co:TiO_2$, $S:TiO_2$, $SnO_2$, $In:SnO_2$, $Ga:SnO_2$, $Zn:SnO_2$, $MoO_3$, $P:MoO_3$, $Nb:MoO_3$, $Ti:MoO_3$, $In:MoO_3$, $V_2O_5$, $Sn:V_2O_5$, $Mo:V_2O_5$, $Mn:V_2O_5$, $Cu:V_2O_5$, $WO_3$, $Fe:WO_3$, $Co:WO_3$, $Ni:WO_3$, $Cu:WO_3$, $Zn:WO_3$, $Nb:WO_3$, $Mo:WO_3$, NiO, Li:NiO, V:NiO, Mn:NiO, Al:NiO, Fe:NiO, Ti:NiO, N:NiO. In addition, a mixture of metal oxides or element-doped metal oxides is also applied to the solutions of the present invention. Wherein, the nanocrystalline metal oxide is preferably zinc oxide, tin oxide, titanium oxide and doped metal oxide.

Further, in order to ensure the good dispersibility of the nanocrystalline metal oxide in an organic solvent, the particle size of the nanocrystalline metal oxide is generally 3 nm to 50 nm, more preferably 5 nm to 15 nm.

Wherein, the solvent is preferably an organic solvent which at least contains an organic alcohol. By adding the organic alcohol in the composite ink, the occurrence of obvious aggregation of nanocrystalline metal oxide particles can be avoided, and the prepared ink is thus effectively stabilized. The organic alcohol is selected from, but not limited to, methanol, ethanol, n-propanol, isopropanol, n-butanol, tert-butanol, ethylene glycol and ethylene glycol monomethyl ether. In addition, a mixed alcohol solvent formed by mixing two or more than two of the above organic alcohols may also be used to stabilize the nanocrystalline metal oxide particles.

In some other implementations, the solvent of the present invention may further include an auxiliary organic solvent. The auxiliary organic solvent may be one or more than two selected from, but not limited to, acetone, chloroform, methylbenzene, dimethylbenzene, trimethylbenzene, chlorobenzene and dichlorobenzene. The auxiliary organic solvent is used for dispersing and stabilizing the prepared composite ink, adjusting the surface tension of the composite ink and improving the film-forming performance of the prepared composite ink.

More preferably, the weight/volume concentration of the polymer-metal oxide nanoparticles in the composite ink of the present invention is 0.5 mg/mL to 60 mg/mL. A lower solid content causes insufficient deposition of a compound during the preparation of a thin film from the compound, while a higher solid content concentration is likely to result in the separation-out of the solid.

More preferably, in the composite ink of the present invention, the weight ratio of the polymer to the nanocrystalline metal oxide is between 1:25 and 1:2.5. A too high polymer proportion will weaken the performance of the metal oxide in improving the stability of the modification layer, while a too low polymer proportion will make it is difficult to uniformly disperse nanocrystalline metal oxide particles so that it is unable to form a compact composite thin film. More preferably, the ratio is between 1:6 and 1:4.

A method for preparing the polymer-nanocrystalline metal oxide composite ink is provided, including the step of: mixing a dispersion solution of the nanocrystalline metal oxide with a solution of the polymer to form the composite ink.

Further, the preparation method may include the following steps of:

(a) dissolving the polymer into an organic solvent 1 to form a polymer solution;

(b) uniformly dispersing the nanocrystalline metal oxide particles into an organic solvent 2 to form a nanocrystalline metal oxide dispersion solution; and (c) uniformly mixing the polymer solution with the nanocrystalline metal oxide dispersion solution at different ratios.

Wherein, the organic solvent 1 or the organic solvent 2 is at least one or more selected from methanol, ethanol, n-propanol, isopropanol, n-butanol, tert-butanol, ethylene glycol and ethylene glycol monomethyl ether.

In the composite ink of the present invention, the solvent needs to be comprehensively selected by considering the dispersion performance of the nanocrystalline metal oxide in different solvents and the requirements for the solvent in the subsequent thin film deposition process. By taking the preparation of a common organic solar cell having a structure of ITO/PEDOT:PSS/P3HT:PC$_{61}$BM/ZnO:PEI/Al as example, in order to prevent the solvent from damaging the optical active layer P3HT:PC$_{61}$BM during the spin-coating of the cathode modification layer ZnO:PEI, the use of solvents such as chlorobenzene and dichlorobenzene as the solvent should be avoided. Therefore, the ZnO nanoparticles are dissolved into the chloroform solvent, PEI is dissolved into methanol, and the both are mixed. However, during the preparation of an inverted organic solar cell having a structure of ITO/ZnO:PEI/P3HT:PC$_{61}$BM/MoO$_3$/Al, since ZnO: PEI is directly prepared on the ITO surface, the solvent will not damage the underlying material. Thus, n-butanol, chlorobenzene or other solvents may be selected according to the requirements for the printing process.

In addition, depending upon different proportions of the solvent, the surface tension of the solvent may be adjusted, and the contact performance of the ink and a substrate is thus improved.

The present invention further provides an application of the polymer-nanocrystalline metal oxide composite ink in preparing a photoelectric device.

As one typical application, the present invention provides a polymer-nanocrystalline metal oxide composite thin film which is mainly formed from the polymer-nanocrystalline metal oxide composite ink, wherein the film-forming method includes coating, printing or the like.

In the practical deposition and preparation process, the polymer-nanocrystalline metal oxide composite thin film is generally deposited on substrate material. The substrate material may include, but not limited to, glass, plastics, paper and metal sheet, for example, stainless steel, aluminum foil or the like. The coating may include, but not limited to, spin-coating, blade-coating, slit-coating and the like; and the printing includes, but not limited to, ink-jet printing, silk-screen printing, gravure printing, flexographic transfer printing and the like.

In practical applications, the polymer-nanocrystalline metal oxide composite thin film of the present invention may also be deposited on some transparent or non-transparent conductive thin films. In other words, there may be a transparent or non-transparent conductive thin film between the composite thin film of the present invention and the substrate material. The transparent conductive thin film includes: an indium tin oxide (ITO) thin film, fluorine-doped tin oxide (FTO), a metal grid thin film, a nanocrystalline metal wire thin film and the like. The non-transparent conductive thin film includes: a nanocrystalline metal thin film prepared by printing or a metal or alloy nano-thin film formed by vacuum deposition, for example, an Al film, an Al:Mg alloy thin film and the like.

In some other application instances, the polymer-nanocrystalline metal oxide composite thin film of the present invention may also be deposited on a functional thin film surface. The functional thin film surface includes a luminescent layer or charge transfer layer in an organic electroluminescent device, an optical active layer or charge transfer layer in an organic solar cell, or a perovskite crystal layer or charge transfer layer in a perovskite solar cell. By depositing the polymer-nanocrystalline metal oxide composite thin film of the present invention on the functional thin film surface, a conventional common organic photoelectric device may be prepared, or a tandem organic photoelectric device, for example, a tandem OLED, a tandem organic solar cell or a tandem perovskite solar cell, may also be prepared.

Furthermore, the present invention discloses an application of the polymer-nanocrystalline metal oxide composite thin film in a photoelectric device. Wherein, the polymer-nanocrystalline metal oxide composite thin film of the present invention may effectively adjust the surface work function of electrodes, so that the interface contact performance between the electrodes and the photoelectric active layer is improved. Therefore, the composite thin film of the present invention may be used in an electronic device with photoelectric conversion characteristics, for example, as an electrode interface modification layer of the cathode.

The typical photoelectric device is, but not limited to, a photoelectric device having electrical-optical and/or optical-electrical conversion characteristics, for example, a solar cell device or an electroluminescent diode device and the like.

For example, in a typical implementation of the present invention, the technical route of the present invention may be summarized as follows.

Synthesis of nanocrystalline metal oxide particles:

1) By taking the synthesis of ZnO nanoparticles as example, a zinc salt as a raw material was magnetically stirred and dissolved into an absolute methanol, and then heated to 60∟ to 65∟ and added with methanol solution of KOH; and the mixture was heated and stirred for 2 h at a constant temperature of 60∟ to obtain ZnO nanoparticles.

2) The resulting nanoparticles were kept standing, cleaned, precipitated, centrifuged and ultrasonically dispersed to eventually obtain the alcohol-dispersed ZnO nanoparticle dispersion solution. The specific operations are as follows: the reaction liquid was kept standing for 3 h; the supernatant was removed; and the precipitate was added with a certain amount of methanol, stirred for 10 min and kept standing overnight, and then, the supernatant was removed; and the resulting precipitate was added with a certain amount of methanol and centrifuged for 10 min at 400 rpm to remove the supernatant and obtain the white precipitate, i.e., ZnO nanoparticles; and, the white precipitate was ultrasonically dispersed with a mixed trichloromethane-methanol solvent to obtain the ZnO nanoparticle dispersion solution.

Preparation of the polymer-nanocrystalline metal oxide:

The nanocrystalline metal oxide particle dispersion solution and the polymer dispersion solution were mixed at a different volume ratio to obtain the polymer-nanocrystalline metal oxide composite ink. By taking a ZnO:PEI composite ink as example, the ZnO:PEI composite ink was obtained by mixing the ZnO dispersion and the PEI dispersion solution at a different volume ratio and then ultrasonically dispersing.

Preparation of a polymer-nanocrystalline metal oxide cathode modification layer:

The polymer-nanocrystalline metal oxide composite ink may be deposited on a surface of an ITO electrode or organic photoactive layer by spin-coating, blade-coating or in other ways, to obtain a cathode modification layer. In some instances, in an organic photoelectric device having an inverted structure, a composite cathode modification layer is deposited, by spin-coating, on the surface of the cathode.

Compared with the conventional cathode modification layer material, the nanocrystalline metal oxide-conductive polymer composition prepared according to the process of the present invention has, as a cathode modification layer for an organic photoelectric device, better film-forming performance, higher stability, simple operation and good experimental repeatability, and may be better technologically combined with printing to prepare an organic photoelectric device.

In a second implementation, the polymer-metal compound composite ink is a polymer-polyoxometalate compound composite ink, containing:

at least one polymer;
at least polyoxometalate compound; and
at least one solvent which is used for forming a uniform disperse system together with the remaining components in the composite ink.

Preferably, the composite material is a disperse system in the form of a uniform fluid, particularly a uniform liquid-phase disperse system. Therefore, the composite material may be considered as a polymer-polyoxometalate compound ink.

In the ink provided by the second implementation of the present invention, by uniformly mixing the polymer and the polyoxometalate compound, the aggregation of the polyoxometalate compound may be reduced, and the film-forming uniformity is improved; meanwhile, the polymer can effectively fill the gaps in the polyoxometalate compound, so that the compactness and uniformity of the compound thin film may be improved, and the roughness of the surface of the interface modification layer may be reduced. Moreover, in the composite interface layer, the polymer may function to adjust the work function of the polyoxometalate compound and thus change the application performance of the photoelectric device.

In some embodiments, the polymer may include, but not limited to, any one of or a combination of more than two of conjugated polymers such as polyaniline, polypyrrole, polyselenophen and derivatives, or non-conjugated polymers such as poly(sulfonic acid) and poly(p-toluenesulfonic acid).

In some typical embodiments, the polymer may be poly (3,4-ethylendioxythiophene)-poly(styrene sulfonic acid) (PEDOT:PSS), and may be applied to organic photoelectric devices and organic/inorganic composite photoelectric devices.

In some embodiments, the polyoxometalate compound may be selected from, but not limited to, polyoxometalate compounds containing any one or more of molybdenum, tungsten and vanadium.

Further, the polyoxometalate compound may further contain, but not limited to, phosphorus, silicon, germanium, arsenicum or other elements.

In some typical embodiments, the polyoxometalate compound may include, but not limited to, Keggin type polyoxometalate compounds, for example, $[BM_{12}O_{40}]^{n-}$, $[PM_{12}O_{40}]^{n-}$, $[SiM_{12}O_{40}]^{n-}$, $[GeM_{12}O_{40}]^{n-}$, $[AsM_{12}O_{40}]^{n-}$ and $[AlM_{12}O_{40}]^{n-}$ (M is molybdenum, tungsten or vanadium, and n is a positive integer); or, Wells-Dawson type polyoxometalate compounds, for example, $[P_2M_{18}O_{62}]^{n-}$ and $[As_2M_{18}]^{n-}$ (M is molybdenum or vanadium, and n is a positive integer); or, Lindqvist type polyoxometalate compounds, for example, $[Mo_6O_{19}]^{2-}$, $[W_6O_{19}]^{2-}$, and polymolybdic ($[Mo_8O_{26}]^{2-}$) or polytungstic ($[W_{10}O_{32}]^{4-}$) based compounds.

Further, in some specific embodiments, the polyoxometalate compound may be a metal polyacid or a salt of the metal polyacid, for example, an ammonium salt, a sodium salt, a potassium salt or the like.

Further, in the polymer-polyoxometalate compound composite ink, the weight ratio of the polymer to the polyoxometalate compound is preferably 1:0.1 to 1:15, particularly preferably 1:1 to 1:3, and further preferably about 1:1. A too high polymer ratio will weaken the performance of the metal oxide in improving the stability of the modification layer, while a too low polymer ratio will make it is difficult to uniformly disperse the nano-material so that it is unable to form a compact composite thin film.

In the polymer-polyoxometalate compound composite ink, the solvent is mainly used for conveniently dispersing the polymer and the polyoxometalate compound, particularly for forming the ink. The solvent may be selected from water, an organic alcohol, a mixture of the water and the organic alcohol, or the like. Preferably, by adding an organic alcohol, the ink may be effectively stabilized, and the wettability of the ink on an organic thin film may be improved. Wherein, the organic alcohol may be selected from, but not limited to, methanol, ethanol, n-propanol, isopropanol, n-butanol, tert-butanol, ethylene glycol, ethylene glycol monomethyl ether and the like. In addition, a mixed alcohol solvent formed by mixing more than two of the above organic alcohols may also be used to stabilize the inorganic nanocluster particles.

In some embodiments, the solvent may further include an auxiliary organic solvent. The auxiliary organic solvent may be one or more than two selected from, but not limited to, acetone, chloroform, methylbenzene, dimethylbenzene, trimethylbenzene, chlorobenzene and dichlorobenzene. The auxiliary organic solvent is mainly used for dispersing and stabilizing the ink, adjusting the surface tension of the ink and improving the film-forming performance of the ink.

In some preferred embodiments, in the polymer-polyoxometalate compound composite ink, the weight/volume concentration of the polymer-polyoxometalate compound composition is 0.5 mg/mL to 20 mg/mL, preferably 3 mg/mL to 8 mg/mL. A lower solid content causes insufficient deposition of the composite material during the preparation of a thin film from the composite material, while a higher solid content concentration is likely to result in the separation-out of the solid.

In some embodiments, the polymer-polyoxometalate compound composite ink may also be used to form a composite ink together with other inks.

One aspect of the present invention further provides a method for preparing a polymer-polyoxometalate compound composite ink, including the step of: uniformly mixing a polymer and a polyoxometalate compound in a solvent to form the composite ink.

In some embodiments, the preparation method includes the steps of: dissolving and/or dispersing the polymer into a solvent to form a first system, dispersing the polyoxometalate compound into a solvent to form a second system, and uniformly mixing the first system and the second system to form the composite ink.

For example, in some specific implementations, the preparation method may include the following steps of:

(a) dissolving the polymer into a solvent 1 to form a polymer solution;

(b) uniformly dispersing the polyoxometalate compound into a solvent 2 to form a polyoxopmetalate compound dispersion liquid or solution; and (c) uniformly mixing the polymer solution with the polyoxometalate compound dispersion liquid or solution at different ratios.

Wherein, the organic solvent 1 or the organic solvent 2 is one or more selected from methanol, ethanol, n-propanol, isopropanol, n-butanol, tert-butanol, ethylene glycol and ethylene glycol monomethyl ether.

In the polymer-polyoxometalate compound composite ink of the present invention, the solvent needs to be comprehensively selected by considering the dispersion performance of the polyoxometalate compound in different solvents and the requirements for the solvent in the subsequent thin film deposition process.

For example, during the preparation of a common organic solar cell having a structure of ITO/ZnO/PTB7:$PC_{61}BM$/PMA:PEDOT:PSS/Al, in order to prevent the solvent from damaging the optical active layer during the spin-coating of the anode modification layer PMA:PEDOT:PSS, the use of solvents such as chlorobenzene and dichlorobenzene as the solvent should be avoided. Therefore, molybdophosphoric acid (PMA) is dispersed into the isopropanol solvent; meanwhile, since the commercial PEDOT:PSS is dispersed into water, the ratio of the alcohol to water needs to be adjusted, so that the ink has higher stability and may be deposited on an organic layer to obtain an uniform and compact thin film.

For another example, during the preparation of a perovskite cell having a structure of ITO/$TiO_2$/PVSK ($CH_3NH_3PbX_3$, $NH_2CH=NH_2PbX_3$, X=Cl, Br or I)/PMA:PEDOT:PSS/Al, since the perovskite thin film will be decomposed when wet with water, the ink must be an anhydrous system; moreover, since alcohols such as butanol or propanol will damage the perovskite thin film to a certain extent, during the configuration of the ink, in addition that the PMA needs to be dispersed into absolute methanol, ethanol, or a mixed solvent of methanol, ethanol and butanol, PEDOT:PSS cannot be dispersed into water. Accordingly, the PMA in this system is dispersed into absolute ethanol, and the PEDOT:PSS is a methylbenzene phase system.

For another example, in a system having a structure of ITO/PMA:PEDOT:PSS/PVSK($CH_3NH_3PbX_3$, $NH_2CH=NH_2PbX_3$, X=Cl, Br or I)/PCBM/Al or ITO/PMA:PEDOT:PSS/PTB7:$PC_{61}BM$/$MoO_3$/Al, since PMA:PEDOT:PSS is directly prepared on an ITO surface, the solvent will not damage the underlying material. Therefore, various solvents may be selected according to the requirements for the printing process and the stability of the ink.

In addition, depending upon different proportions of the solvent, the surface tension of the solvent may be adjusted, and the contact performance of the ink and a substrate is thus improved.

One aspect of the present invention further provides an application of the polymer-polyoxometalate compound composite ink, for example, an application in preparing a photoelectric device, particularly an application in using as electrode interface modification material.

One aspect of the present invention further provides a thin film which is mainly formed from the polymer-polyoxometalate compound composite ink.

Since the polymer-polyoxometalate compound composition provided by the present invention is uniformly dispersed into the solvent, in the thin film prepared from the composite material of the present invention, the polymer and the polyoxometalate compound may be better mixed to form a uniform composite thin film. Moreover, the polymer can effectively fill the gaps in the polyoxometalate compound, so that the compactness and uniformity of the composite thin film may be improved and the surface flatness of the composite thin film may be improved.

One aspect of the present invention further provides a method for preparing the thin film, including the step of: applying the polymer-polyoxometalate compound composite ink onto a substrate by coating or printing to form the thin film.

In the practical deposition and preparation process, the thin film may be directly deposited on an active layer surface or various functional thin film surfaces. The functional thin film surfaces may include a luminescent layer or charge transfer layer in an organic electroluminescent device, a photoactive layer or charge transfer layer in an organic solar cell, or a perovskite crystal layer or charge transfer layer in a perovskite solar cell, or the like. In terms of material, the functional thin films may include a polymer or small-molecular single or blended thin film, an organic thin film, an organic-inorganic hybrid thin film, or the like. By depositing the thin film of the present invention on the functional thin film surface, a conventional common organic photoelectric device may be prepared, or a tandem organic photoelectric device, for example, a tandem OLED, a tandem organic solar cell or a tandem perovskite solar cell, may also be prepared. The coating may include, but not limited to, spin-coating, blade-coating, slit-coating and the like; and the printing includes, but not limited to, ink-jet printing, silk-screen printing, gravure printing, flexographic transfer printing and the like.

In some implementations, the thin film of the present invention may also be directly deposited on other various substrate surfaces, wherein the substrate material may include, but not limited to, glass, plastics, paper and metal sheet, for example, stainless steel, aluminum foil or the like.

In some embodiments, the thin film of the present invention may also be deposited on some transparent or non-transparent conductive thin films. Or, it may also be considered that there may be a transparent or non-transparent conductive thin film between the thin film of the present invention and the substrate material. The transparent conductive thin films include, but not limited to, an indium tin oxide (ITO) thin film, a fluorine-doped thin oxide (FTO), a metal grid thin film, nanocrystalline metal wire thin film and the like. The non-transparent conductive thin films include, but not limited to, a nanocrystalline metal thin film prepared by printing or a metal or alloy nano-thin film formed by vacuum deposition, for example, an Al film, a Cu film, an Ag film, an Al:Mg alloy thin film and the like.

One aspect of the present invention further provides an application of the thin film, for example, an application in using as functional material or a functional unit in some devices.

Preferably, the device is a photoelectric device having electrical-optical and/or optical-electrical conversion characteristics.

In some embodiments, the thin film of the present invention may be used as electrode interface modification material, for example, an interface modification layer for an anode. The thin film may effectively adjust the surface work function of the electrode, and thus improve the interface contact performance between the electrode and the photoelectric active layer.

Some typical photoelectric devices may be, but not limited to, a solar cell device, an electroluminescent diode device or the like.

Further, the implementation process of a typical implementation instance of the present invention may be summarized as follows.

1) Preparation of the polymer-polyoxometalate compound composite ink:

The dispersion liquid/solution of the polyoxometalate compound and the dispersion liquid/solution of the polymer were mixed at a different volume ratio to obtain the polymer-polyoxometalate compound composite ink. By taking the molybdophosphoric acid (PMA):PEDOT:PSS composite ink as example, the isopropanol dispersion liquid of PMA and the water dispersion liquid of PEDOT:PSS were mixed at a different volume ratio and then ultrasonically dispersed to obtain the PMA:PEDOT:PSS composite ink.

2) Preparation of a polymer-polyoxometalate compound composite modification layer:

The polymer-nanocrystalline metal oxide composite ink may be deposited on a surface of an ITO electrode or organic photoactive layer by spin-coating, blade-coating or in other ways, to obtain an anode modification layer. For example, in some embodiments, in an organic photoelectric device having an inverted structure, a composite anode modification layer is deposited, by spin-coating, on the surface of the organic active layer. However, in some other embodiments, in a perovskite cell, the composite anode modification layer is directly deposited on a transparent conductive electrode. Compared with the conventional anode modification layer material, the composite anode modification layer has better film-forming performance, higher stability, inexpensive material, simple operation, good experimental repeatability, and may be better technologically combined with printing to an organic photoelectric device.

The technical solutions of the present invention will be further described below by several preferred embodiments with reference to the accompanying drawings.

Embodiment 1: Preparation of ZnO:PEI (Zinc Oxide:Polyethyleneimine) Composite Ink and its Application in an Organic Photovoltaic Device The specific operation steps of this embodiment are as follows.

1. Preparation of ZnO nanoparticles: 2.950 g of zinc acetate dehydrate was dissolved into 125 mL of absolute methanol, and then heated to 60∟ while stirring. 1.480 g of potassium hydroxide was ultrasonically dissolved into 65 mL of absolute methanol, the methanol solution of potassium hydroxide was quickly added into the zinc acetate solution, and the mixture was heated to 60∟ to 65∟ and then magnetically stirred for 2 h at 600 rpm. During the reaction, the solution was first colorless and then separated out white precipitate; then, the precipitate disappeared gradually, and the solution became light blue; about 2 h later, white precipitate was separated out; the system was continuously heated for 0.5 h; the heating was stopped, the reaction was completed.

2. Preparation of ZnO ink: After the ZnO nanoparticles were prepared, the reaction liquid was kept standing for 3 h, the supernatant was then removed, 50 mL of absolute methanol was added, and the system was stirred for 10 min at 600 rpm and then kept standing overnight; after the supernatant and the white precipitate were layered completely, the supernatant was removed, 50 mL of absolute methanol was added, and the system was stirred for 10 min at 600 rpm and then centrifuged for 10 min at 4000 rpm; and the precipitate was obtained, i.e., ZnO nanoparticles. 10 mL of trichloromethane and 1 mL of methanol were added into the white precipitate, and the mixture was ultrasonically dispersed to obtain transparent light blue dispersion liquid of the ZnO nanoparticles. The ZnO ink is uniformly dispersed and stable. The ZnO ink is stored at room temperature and may be added with a proper amount of the mixed trichloromethane-methanol solvent for dilution to obtain ZnO ink having different concentrations.

3. Preparation of PEI ink: 10 mg of PEI solid was added with about 3.3 mL of absolute methanol until the total mass became 2.5 g, and the mixture was ultrasonically dissolved to obtain the PEI ink having a concentration of 0.4% by weight.

4. Preparation of ZnO:PEI composite ink: the ZnO ink having a concentration of 10 mg/mL and the PEI ink having a weight concentration of 0.4% were mixed at different volume ratios, the weight ratio of the ZnO ink to the PEI ink was adjusted, and the mixture was ultrasonically dispersed to obtain clear and transparent ZnO:PEI composite ink.

5. Preparation of an inverted device using ZnO:PEI as a cathode modification layer: the inverted device structurally includes an ITO cathode, a ZnO:PEI composite cathode modification layer, a P3HT:PC$_{61}$BM photoactive layer, a MoO$_3$ anode modification layer, and an Al anode. By comparing the device performance at different weight ratios of ZnO to PEI, an optimal ZnO:PEI blend ratio was obtained. The device structure was ITO/ZnO:PEI/P3HT:PC$_{61}$BM/MoO$_3$/Al. The ZnO:PEI composite cathode modification layer was spin-coated for 1 min at 2300 rpm, and then annealed in a glove box for 10 min at 124∟. It can be seen from the device performance parameters in Table 1 that, when the weight ratio of ZnO:PEI is between 25:3 and 25:7.5, the performance of the solar cell device changes slightly; and when the weight ratio of ZnO:PEI is increased from 25:12 and 25:15, the short-circuit current and the filling factor of the device will be reduced greatly, and the J-V curve of the device has a S-type curve. It is indicated that the optimal weight ratio of ZnO:PEI is between 25:3 and 25:7.5, and the increase of the weight of PEI has influenced the effect of ZnO in modifying the ITO electrode.

6. Preparation of an inverted device using ZnO, ZnO:PEI and PEI as a cathode modification layer: ZnO, ZnO:PEI and PEI as a cathode modification layer were respectively used in an inverted device, and the influences of the three cathode modification layers on the device performance were compared. All the ZnO ink, the ZnO:PEI ink and the PEI ink were spin-coated for 1 min at 2300 rpm, and then annealed in a glove box for 10 min at 124∟. The three structures, as a cathode modification layer, were used in an inverted structure device having a structure of ITO/ETL/P3HT:PC$_{61}$BM/MoO$_3$/Al.

Figure 3A:
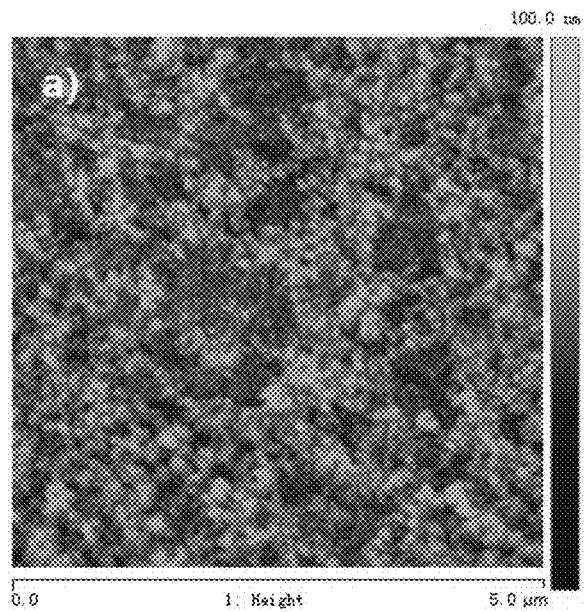
FIGS. 3a-3b are AFM charts of a ZnO thin film and a ZnO:PEI thin film according to Embodiment 1, respectively.
Figure 3B:
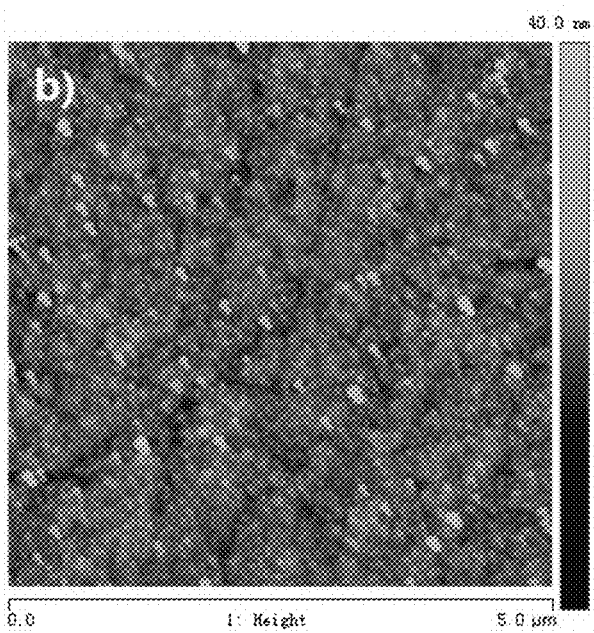
Figure 4:
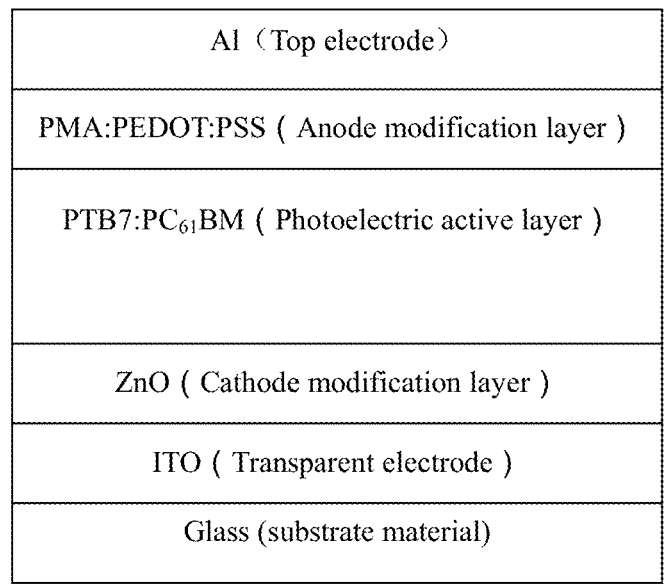
FIG. 4 is a schematic structure diagram of a solar cell according to Embodiment 3.

It can be seen from the J-V curve in FIG. 1 and the performance parameters in Table 1 that, the device using ZnO:PEI as a composite cathode modification layer has better performance than the device using PEI alone as a cathode modification layer; moreover, compared with the device using ZnO as a cathode modification layer, it is advantageous to improve the FF of the device and the overall performance of the device will not be reduced. It can be seen from the AFM chart (FIG. 3) of the thin film that, the combination of ZnO and PEI effectively reduces the aggregation of ZnO nanoparticles, and the surface roughness of the ZnO:PEI thin film is less than that of the ZnO thin film. Therefore, it can be seen from the comparison of the three device structures that the combination of ZnO and PEI at a proper weight ratio may effectively reduce the aggregation of ZnO nanoparticles, and the device using a composite thin film as the cathode modification layer may have a performance equivalent to the device using a single ZnO layer as the cathode modification layer.

TABLE 1

Device performance parameters of a P3HT:PC$_{61}$BM system solar cell using ZnO, ZnO:PEI and PEI as a cathode modification layer in Embodiment 1

| Device | $J_{SC}$ [mA·cm$^{-2}$] | $V_{OC}$ [V] | FF | Mpp [%] |
| --- | --- | --- | --- | --- |
| ZnO | 0.61 | 7.84 | 0.60 | 2.87 |
| ZnO:PEI (25:3, w/w) | 0.60 | 7.64 | 0.61 | 2.80 |
| ZnO:PEI (25:4.5, w/w) | 0.60 | 7.57 | 0.63 | 2.86 |
| ZnO:PEI (25:6, w/w) | 0.60 | 7.73 | 0.60 | 2.78 |
| ZnO:PEI (25:7.5, w/w) | 0.60 | 7.26 | 0.64 | 2.79 |
| ZnO:PEI (25:12, w/w) | 0.60 | 3.91 | 0.17 | 0.40 |
| ZnO:PFN (25:15, w/w) | 0.58 | 0.34 | 0.15 | 0.03 |
| PEI | 0.57 | 5.36 | 0.56 | 1.71 |

Embodiment 2

Preparation of ZnO:PEIE composite ink: a ZnO ink (its preparation process may refer to Embodiment 1) having a concentration of 10 mg/mL and a PEIE (80% methoxylatedpolyethylenimine) solution having a weight concentration of 0.4% were mixed at a different volume ratio and ultrasonically dispersed to obtain the ZnO:PEIE composite ink.

Preparation of ZnO:PEIE composite cathode modification layer: spin-coating was performed on the ITO surface at 2300 rpm to obtain a ZnO:PEIE composite cathode modification layer.

Embodiment 3: Preparation of PMA:PEDOT:PSS Composite Ink and its Application in an Organic Photovoltaic Device 1. The preparation process of the PMA:PEDOT:PSS composite ink includes the following steps.

(1) Preparation of PMA ink: 1 mg of H$_3$PO$_4$.12MoO$_3$.3H$_2$O (PMA) powder was added with 1 mL of redistilled isopropanol, and the mixture was ultrasonically processed to be completely dispersed to obtain the PMA ink having a weight concentration of 1 mg/mL.

(2) Preparation of PMA:PEDOT:PSS composite ink: the PMA ink having a concentration of 1 mg/mL and an PEDOT:PSS (Clevios PV P AI4083) ink were mixed at a different volume ratio and then ultrasonically dispersed to obtain the PMA:PEDOT:PSS composite ink.

2. The preparation process of a corresponding PMA:PEDOT:PSS composite thin film includes: coating the PMA:PEDOT:PSS composite ink on substrate material by spin-coating, blade-coating or other common methods, and drying to obtain the composite thin film.

Figure 5A:
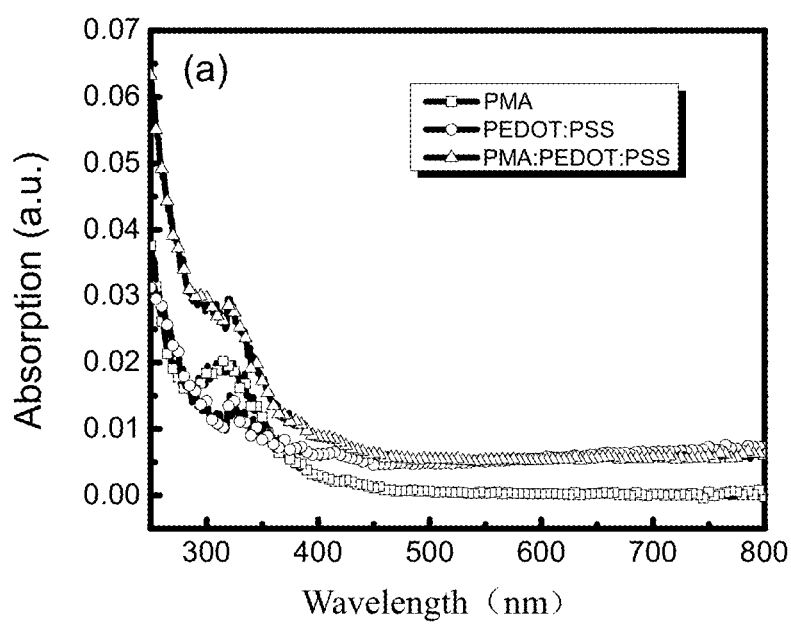
FIG. 5a is an absorption spectrogram of PMA, PEDOT:PSS and PMA:PEDOT:PSS thin films according to Embodiment 3.
Figure 5B:
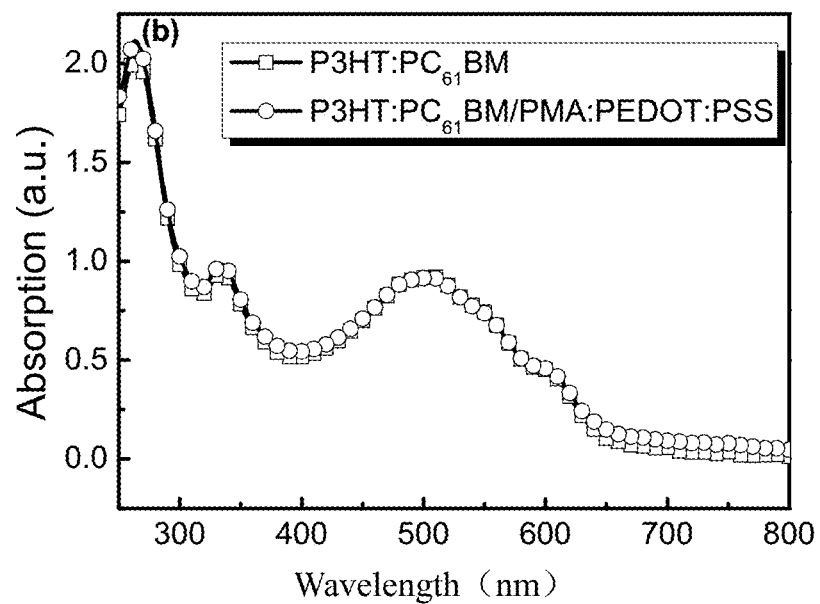
FIG. 5b is an absorption spectrogram when PEDOT:PSS and PMA:PEDOT:PSS are deposited on P3HT:$PC_{61}BM$, respectively, according to Embodiment 3.

Characterization results of the PMA:PEDOT:PSS thin film will be described below. Referring to FIG. 5a, this composite thin film exhibits an absorbability within an ultraviolet region and a near-infrared region, wherein the absorbability within the near-infrared region is resulted from the absorbability of PEDOT:PSS. Referring to FIG. 5b, by observing the absorption spectra of the P3HT:PC$_{61}$BM thin film before and after the deposition of PMA:PEDOT:PSS, it can be determined that this composite thin film may be deposited on the surface of an active layer.

Figure 6A:
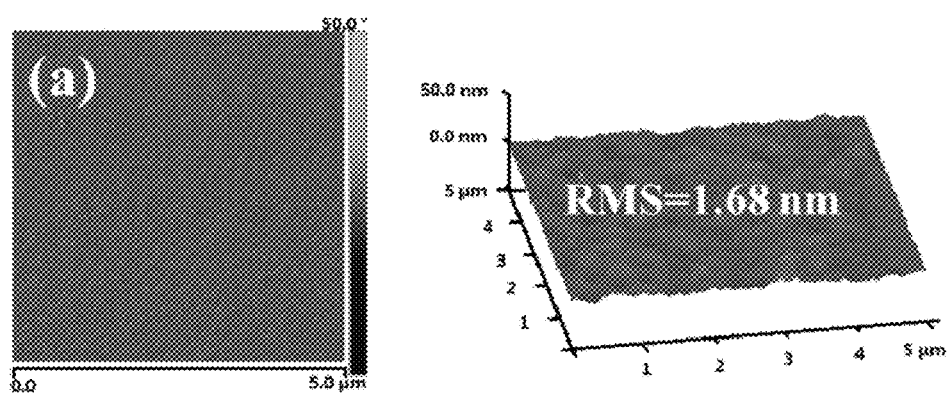
FIGS. 6a-6c are AFM charts of a PTB7:$PC_{61}BM$ thin film, a PTB7:$PC_{61}BM$/PMA thin film and a PTB7:$PC_{61}BM$/PMA:PEDOT:PSS thin film according to Embodiment 3, respectively.
Figure 6B:
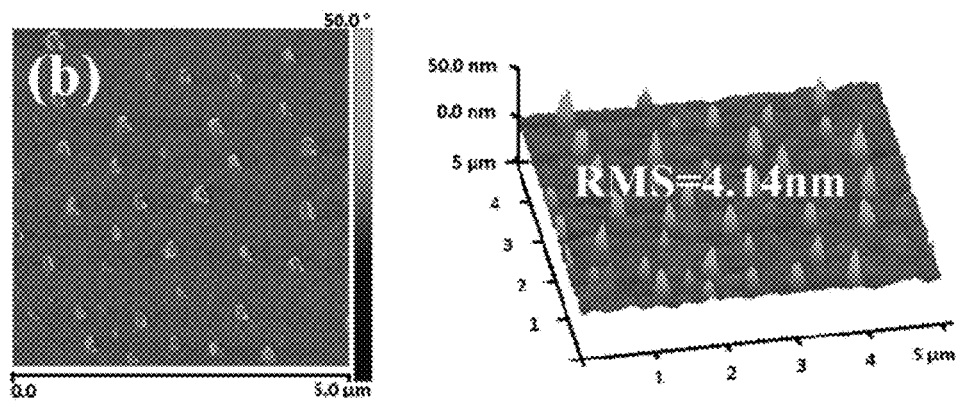
Figure 6C:
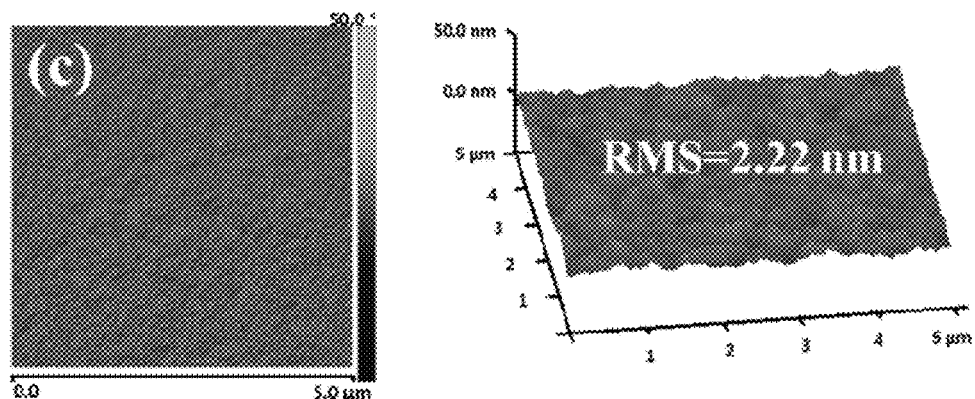

3. The preparation of an inverted device using the PMA:PEDOT:PSS composite thin film as an anode modification layer, which structurally includes an ITO cathode, a ZnO cathode modification layer, a PTB7:PC$_{61}$BM photoactive layer, a PMA:PEDOT:PSS anode modification layer and an Al anode. The preparation process of such inverted device includes the following steps. preparing an inverted device having a structure of ITO/ZnO/PTB7:PC$_{61}$BM/anode modification layer/Al was by using PMA, PEDOT:PSS, PMA:PEDOT:PSS and evaporated MoO$_3$ as an anode modification layer, respectively. All the PMA ink, the PMA:PEDOT:PSS ink and the PEDOT ink were spin-coated for 1 min at 2300 rpm, and then annealed in a glove box for 10 min at 124∟. Referring to FIGS. 6a-6c, it can be seen from the AFM charts of the thin film that the pure PMA ink forms an island-like thin film on the PTB7:PC$_{61}$BM thin film, where the size of the island is about 100 nm. This is mainly because of the aggregation of the PMA. Thus, the roughness of the PTB7:PC$_{61}$BM thin film is increased from 1.7 nm to 4.1 nm. However, the combination of PMA and PEDOT:PSS improves the aggregation phenomenon of the PMA particles, so that the roughness of the obtained PMA:PEDOT:PSS thin film is 2.1 nm.

Figure 7A:
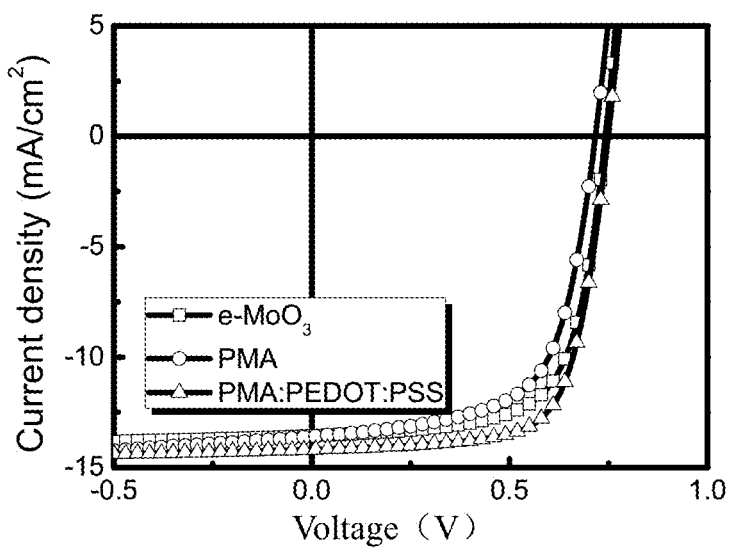
FIGS. 7a-7b are J-V graphs of a PTB7:$PC_{61}BM$ system solar energy cell using PMA, PEDOT:PSS, PMA:PEDOT:PSS and evaporated $MoO_3$ (e-$MoO_3$) as an anode modification layer according to Embodiment 3.
Figure 7B:
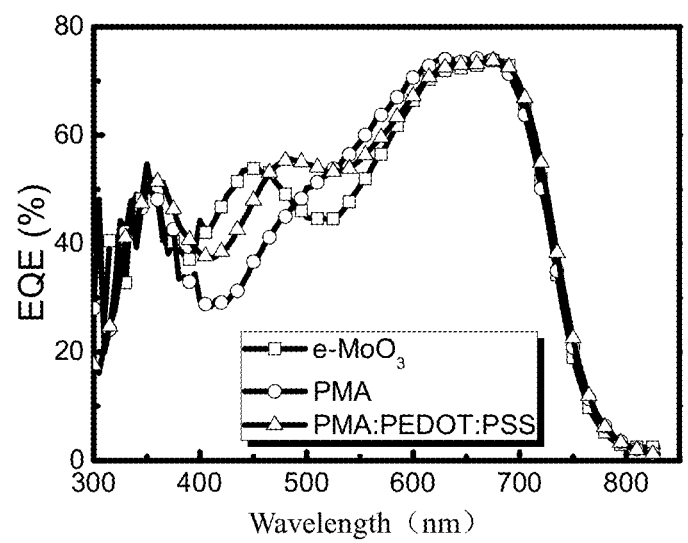
Figure 8A:
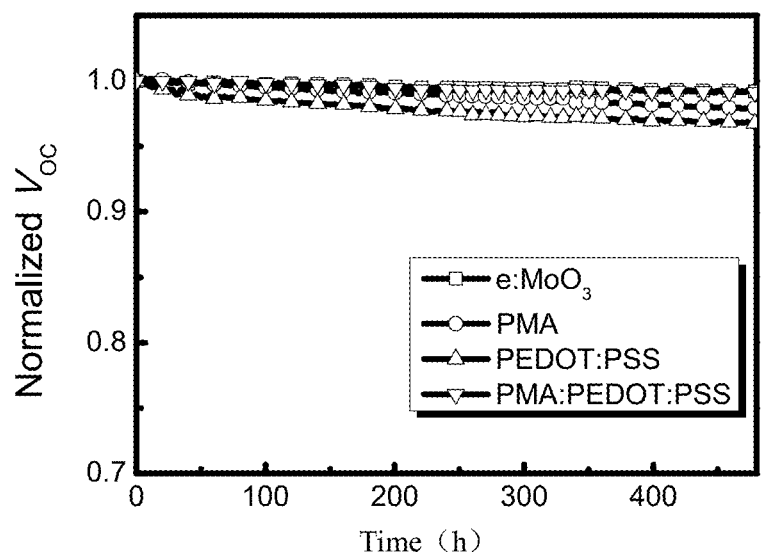
FIGS. 8a-8d are stability test diagrams of an inverted structure device using PMA, PEDOT:PSS, PMA:PEDOT:PSS and evaporated $MoO_3$ (e-$MoO_3$) as an anode modification layer.
Figure 8B:
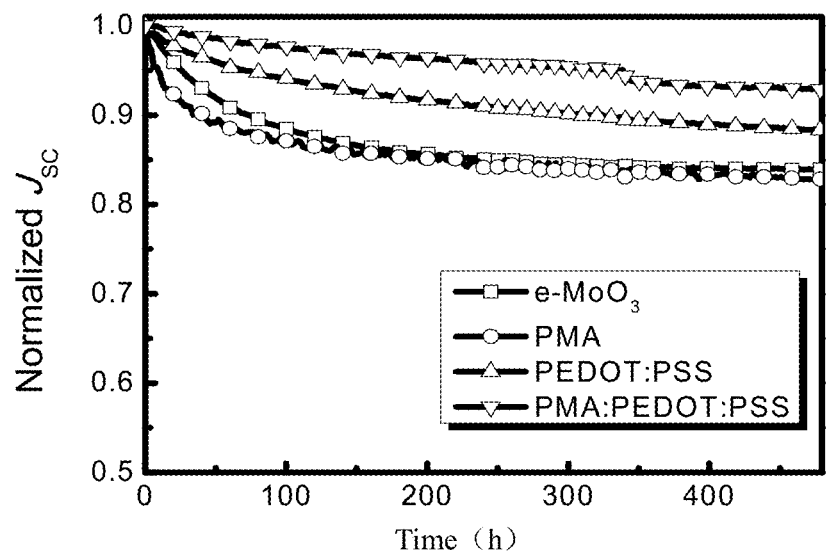
Figure 8C:
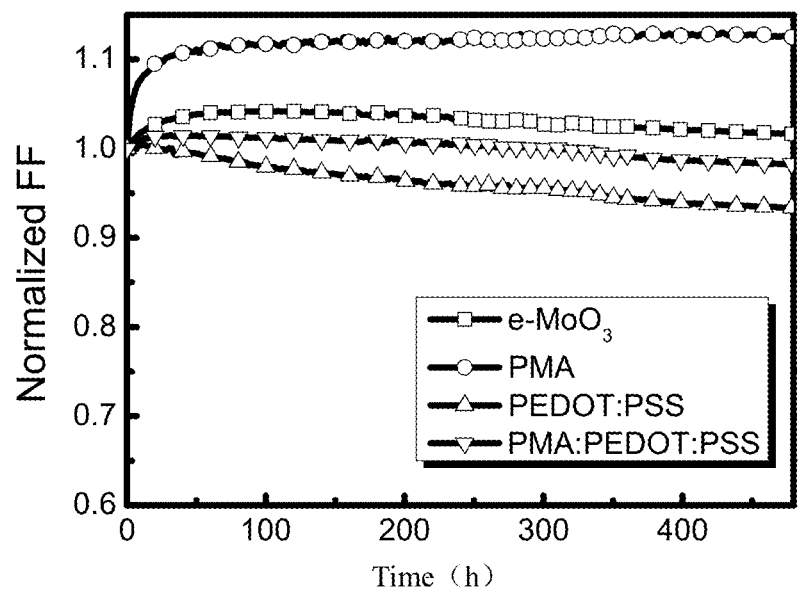
Figure 8D:
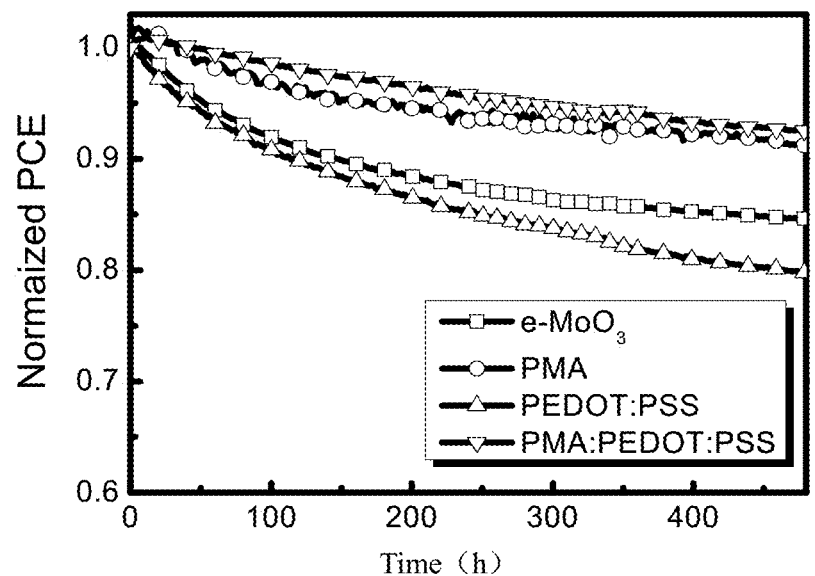

It can be seen from the J-V curves in FIGS. 7a-7b and the performance parameters in Table 2 that, the device using PMA:PEDOT:PSS as the composite anode modification layer has better performance than the device using PMA alone as the anode modification layer; moreover, compared with the device using PMA as the anode modification layer, both the open-circuit voltage and the short-circuit current of the device are increased obviously, and the overall device efficiency is improved by about 20%. In addition, it can be seen from FIGS. 8a-8d that, the device obtained by using the PMA:PEDOT:PSS composite thin film as the anode modification layer has better stability during long-time operation than the reference devices using PEDOT:PSS alone, PMA alone and e-MoO$_3$ as the anode modification layer.

TABLE 2

Device performance parameters of a PTB7:PC$_{61}$BM system solar cell using PMA, PMA:PEDOT:PSS and e-MoO$_3$ as an anode modification layer in Embodiment 1

| Anode modification layer | Open-circuit voltage (V) | Short-circuit current (mA/cm$^2$) | Filling factor (%) | Efficiency (%) |
| --- | --- | --- | --- | --- |
| e-MoO$_3$ | 0.74 | 13.56 | 68 | 6.82 |
| PMA | 0.72 | 13.60 | 64 | 6.27 |
| PMA:PEDOT:PSS | 0.75 | 14.18 | 70 | 7.44 |

Embodiment 4: Application of PMA:PEDOT:PSS Composite Layer in a Perovskite Cell 1. The preparation process of the PMA:PEDOT:PSS composite ink includes the following steps:

(1) Preparation of PMA ink: x mg of $H_3PO_4 \cdot 12MoO_3 \cdot 3H_2O$ (PMA) powder was added with 1 mL of redistilled isopropanol, and the mixture was ultrasonically processed to be completely dispersed to obtain the PMA ink having a weight concentration of x mg/mL.

(2) Preparation of PMA:PEDOT:PSS composite ink: the PMA ink and the PEDOT:PSS (AI4083) ink were mixed at a volume ratio of 10:1 and then ultrasonically dispersed to obtain a series of PMA:PEDOT:PSS composite inks.

2. Preparation and performance test of a perovskite cell using PMA:PEDOT:PSS as an anode modification layer: in this embodiment, the structure of the perovskite cell is ITO/PMA:PEDOT:PSS/PVSK/PCBM/Al, wherein a device using PEDOT:PSS alone as a modification layer is used as a reference device. Table 3 shows performance parameters of this device. It can be seen that the device obtained by using the PMA:PEDOT:PSS compound as an anode modification layer has a similar performance to the device containing PEDOT:PSS alone. It is indicated that the PMA:PEDOT:PSS composite layer may be used as an anode modification layer for a perovskite cell.

TABLE 3

Device performance statistics of the perovskite cell using 10% PMA (mg/mL):PEDOT:PSS as the anode modification layer

| Anode modification layer | Open-circuit voltage (V) | Short-circuit current (mA·cm$^{-2}$) | Filling factor (%) | Efficiency (%) |
| --- | --- | --- | --- | --- |
| PEDOT:PSS | 0.85 | 18.0 | 64 | 9.76 |
| PMA/PEDOT:PSS | 0.84 | 17.6 | 55 | 8.15 |
| 0.1 mg/mL PMA:PEDOT:PSS | 0.84 | 18.0 | 62 | 9.38 |
| 0.2 mg/mL PMA:PEDOT:PSS | 0.85 | 18.0 | 58 | 8.86 |
| 0.5 mg/mL PMA:PEDOT:PSS | 0.83 | 18.0 | 62 | 9.24 |
| 1 mg/mL PMA:PEDOT:PSS | 0.83 | 18.0 | 63 | 9.46 |
| 2 mg/mL PMA:PEDOT:PSS | 0.82 | 18.1 | 65 | 9.65 |

Embodiment 5: Application of a Phosphotungstic Acid ($H_3PW_{12}O_{40}$, PWA):Benzenesulfonic Acid (PSS) Composite Interface Layer in an Organic Solar Cell 1 mg of PWA was dissolved into isopropanol to obtain an ink having a concentration of 5 mg/mL, 5 mg of benzenesulfonic acid was dissolved into water to obtain a solution having a concentration of 5 mg/mL, and the PWA solution and benzenesulfonic acid solution at the same volume were mixed to obtain a composite ink having a weight ratio of 1:1 and a total weight concentration of 5 mg/mL.

Figure 9:
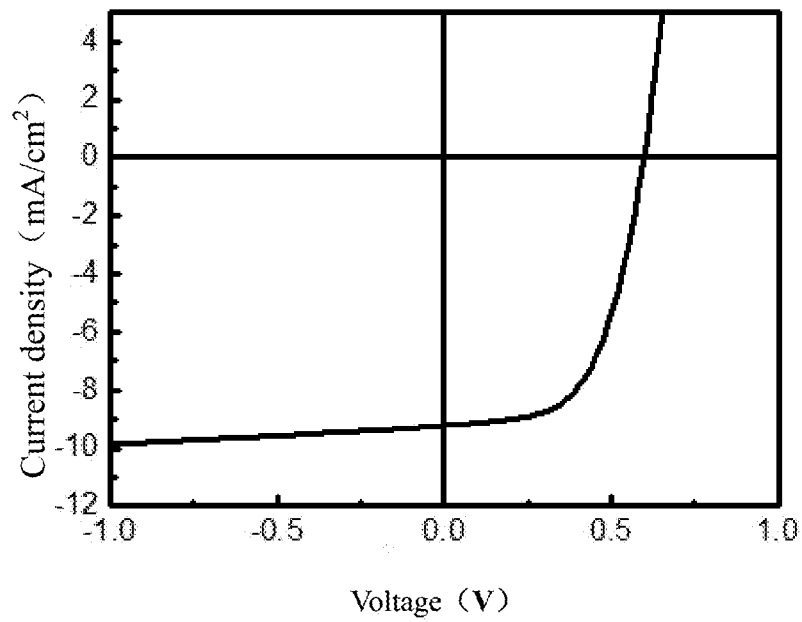
FIG. 9 is a J-V curve of the obtained device according to Embodiment 5.

Preparation of a cell based on the PWA:PSS composite layer: a PWA:PSS composite layer having a thickness of about 30 nm was prepared on an piece of ITO glass by blade-coating, then a layer of P3HT:PC$_{61}$BM/ZnO was successively spin-coated, and an Al electrode was thermally evaporated. FIG. 9 shows a J-V curve of this device.

Embodiment 6: Application of a Composite Interface Layer Based on Silicomolybdic Acid (SMA):Polymer in a Perovskite Solar Cell (PVSK)

Preparation of silicomolybdic acid: composite ink: 30 mg of silicomolybdic acid (SiMo$_{12}$O$_{40}$) was dissolved into 1 mL of methanol, and a polyfluorene derivative (CPE-K) methanol ink having a concentration of 3 mg/mL was prepared, and the silicomolybdic acid and the polyfluorene ink were mixed at a certain ratio to obtain a composite ink having a total concentration of 20 mg/mL. A composite interface layer thin film may be formed from the ink by spin-coating or in other ways.

A perovskite cell having a structure of ITO/TiO$_2$/PVSK/SMA:CPE-K/Al was prepared, wherein the composite layer was used as a composite anode interface layer to modify the Al electrode in the cell, and the obtained device had the following performances: $V_{OC}$=0.80 V, $J_{SC}$=18.05 mA/cm$^2$, FF=60% and PCE=8.7%.

Embodiment 7: Application of the PMN:Composite Interface Layer in an Organic Solar Cell Polyvinylpyrrolidone (PVP) and ammonium phosphomolybdate (($NH_4$)$_6$PMo$_{18}$O$_{62}$, PMN) were dissolved into water respectively to obtain solution having a concentration of 10 mg/mL, and the two solutions were mixed at a weight ratio of 1:10 to obtain a composite ink based on ammonium phosphomolybdate and polyvinylpyrrolidone (PMN:PPV).

An organic solar cell having a structure of ITO/PMN:PPV/PTB7:PC$_{61}$BM/LiF/Al was prepared, where the obtained device had the following performances: $V_{OC}$=0.73 V, $J_{SC}$=13.6 mA/cm$^2$, FF=65% and PCE=6.5%.

Embodiment 8: Application of a Wolframic Acid (WA) Composite Interface Layer in an Organic Solar Cell Polyvinylpyrrolidone (PVP) and $H_2W_6O_{19}$ were dissolved into water to obtain a solution having a concentration of 2 mg/mL and a solution having a concentration of 10 mg/mL, respectively, and the two solutions were mixed at a weight ratio of 1:10 to obtain a composite ink based on $H_2W_6O_{19}$ and polyvinylpyrrolidone (WA:PPV).

An organic solar cell having a structure of ITO/WA:PPV/PTB7:PC$_{71}$BM/LiF/Al was prepared, where the obtained device had the following performances: $V_{OC}$=0.72 V, $J_{SC}$=15.7 mA/cm$^2$, FF=65% and PCE=7.3%.

Embodiment 9: Application of a Phosphotungstic Acid ($H_3PW_{12}O_{40}$, PWA) Composite Interface Layer:PEI Compound as a Cathode Interface Layer in an Organic Solar Cell 1 mg of PWA was dissolved into methanol to obtain an ink having a concentration of 5 mg/mL, 1 mg of PEI was dispersed into water to obtain a solution having a concentration of 1 mg/mL, and the PWA solution and benzenesulfonic acid solution at the same volume were mixed to obtain a composite ink having a weight ratio of 1:1 and a total weight concentration of 2.5 mg/mL.

Preparation of a cell based on the PWA:PEI composite layer: PEDOT:PSS, a PffBT4T2OD:PC$_{61}$BM active layer, a PWA:PEI composite layer and an evaporated Al electrode were successively prepared on a piece of ITO glass by spin-coating. By tests, the device had the following performances: $V_{OC}$=0.75 V, $J_{SC}$=17.76 mA/cm$^2$, FF=67% and PCE=8.92%.

It is to be noted that that various raw material, process conditions, device material and structural parameters used in the forgoing embodiments are typical instances, and based on the verification by the inventor(s) through lots of tests, other types of raw material and other process parameters different from those listed above are also applicable and may achieve the technical effects of the present invention.

The invention claimed is:

1. A photoelectric device comprising a multilayer structure,
wherein the multilayer structure comprises a cathode electrode, an anode electrode, a photoelectric active layer, and an interface modification layer between the electrodes and the photoelectric active layer,
wherein the interface modification layer is a compact composite thin film formed from a polymer-polyoxometalate composite ink, the compact composite thin film having a thickness of not greater than about 30 nm, the interface modification layer comprising
at least one polymer;
at least one polyoxometalate compound material; and
at least one solvent which is used for forming a disperse system in the form of a uniform fluid together with the remaining components in the composite ink,
wherein the at least one polyoxometalate compound material comprises any one of or a combination of more than two of molybdenum, tungsten and vanadium,
wherein the mass ratio of the at least one polymer to the at least one polyoxometalate compound material is 1:1 to 1:3, and
wherein the concentration of the at least one polymer and the at least one polyoxometalate compound material in the composite material is 0.5 to 20 mg/mL.

2. The photoelectric device according to claim 1, wherein the photoelectric device has electrical-optical and/or optical-electrical conversion characteristics; and the photoelectric device comprises a solar cell device or an electroluminescent diode device.

3. The photoelectric device according to claim 1, wherein the at least one polyoxometalate compound material further contains any one of or a combination of more than two of phosphorus, silicon, germanium and arsenicum.

4. The photoelectric device according to claim 1, wherein the at least one polyoxometalate compound material comprises any one of or a combination of more than two of Keggin type polyoxometalate compounds, Wells-Dawson type polyoxometalate compounds and Lindqvist type polyoxometalate compounds.

5. The photoelectric device according to claim 1, wherein the at least one polyoxometalate compound material comprises metal polyacid and/or salt of the metal polyacid.

6. The photoelectric device according to claim 1, wherein the at least one polymer comprises a conjugated polymer and/or a non-conjugated polymer.

7. The photoelectric device according to claim 1, wherein the at least one polymer comprises any one of polyaniline, polythiophene, polypyrrole, polyselenophen, poly(sulfonic acid), poly(p-toluenesulfonic acid) and polyfluorene derivative, or a derivative thereof.

8. The photoelectric device according to claim 1, wherein the solvent comprises any one of or a combination of more than two of water and organic alcohol.

9. The photoelectric device according to claim 1, wherein the concentration of the at least one polymer and the at least one polyoxometalate compound material in the composite material is 3 to 10 mg/mL.

10. The photoelectric device according to claim 1, wherein the organic alcohol comprises any one of or a combination of more than two of methanol, ethanol, n-propanol, isopropanol, n-butanol, tert-butanol, ethylene glycol and ethylene glycol monomethyl ether.

11. The photoelectric device according to claim 1, wherein the solvent further comprises an auxiliary organic solvent, and the auxiliary organic solvent comprises any one of or a combination of more than two of acetone, chloroform, methylbenzene, dimethylbenzene, trimethylbenzene, chlorobenzene and dichlorobenzene.

12. A method for preparing the polymer-polyoxometalate composite ink according to claim 1, comprising the step of: uniformly mixing the at least one polymer and the at least one polymetalate compound material in a solvent to form the polymer-polyoxometalate composite ink.

13. The preparation method according to claim 12, further comprising: dissolving and/or dispersing the at least one polymer into the solvent to form a first system, dispersing the at least one polymetalate compound material into the solvent to form a second system, and uniformly mixing the first system and the second system to form the polymer-polyoxometalate composite ink.

* * * * *